United States Patent [19] [11] 4,121,182
Makimoto et al. [45] Oct. 17, 1978

[54] ELECTRICAL TUNING CIRCUIT

[75] Inventors: Mitsuo Makimoto; Sadahiko Yamashita, both of Kawasaki, Japan

[73] Assignee: Matsushita Electric Industrial Co., Limited, Japan

[21] Appl. No.: 771,987

[22] Filed: Feb. 25, 1977

[30] Foreign Application Priority Data

Feb. 26, 1976 [JP] Japan .................................. 51/21502
Feb. 26, 1976 [JP] Japan .................................. 51/21503

[51] Int. Cl.² ............................ H03H 7/10; H03J 3/18

[52] U.S. Cl. ............................... 333/73 S; 331/177 V; 333/10; 333/84 M; 325/453; 334/15; 334/45

[58] Field of Search ................. 331/36 C, 101, 177 V, 331/96; 333/73 S, 82 R, 82 B, 84 M; 334/41, 42, 45, 15; 307/320

[56] References Cited

U.S. PATENT DOCUMENTS

| | | | |
|---|---|---|---|
| 3,651,409 | 3/1972 | George et al. | 334/42 X |
| 4,001,734 | 1/1977 | Burns | 333/31 R |

*Primary Examiner*—Paul L. Gensler
*Attorney, Agent, or Firm*—Lowe, King, Price & Becker

[57] ABSTRACT

A first and second strip are provided on a dielectric substrate such that one end of the first strip juxtaposes one end of the second strip and the other end of the first strip juxtaposes the other end of the second strip. A capacitor is provided between the one ends of the first and the second strips and a varactor is provided between the other ends of the first and the second strips.

15 Claims, 17 Drawing Figures

Fig. 4a
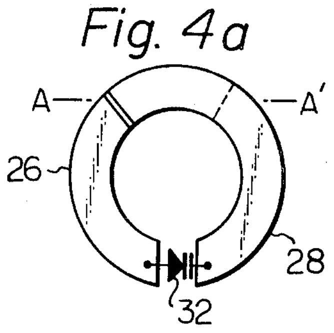
Fig. 4b
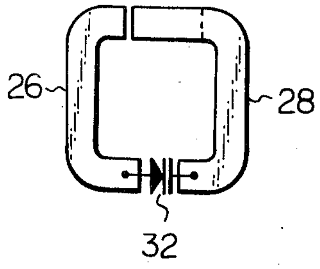
Fig. 4c
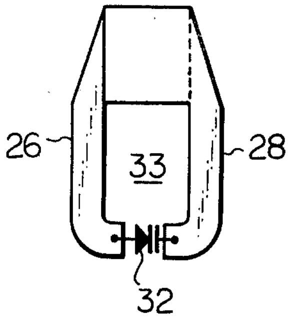
Fig. 4d
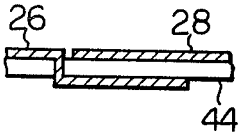
Fig. 5a
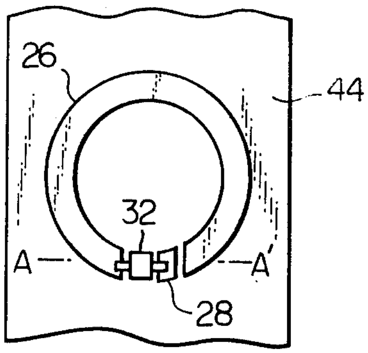
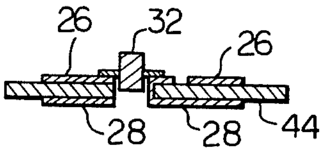
Fig. 5b

ELECTRICAL TUNING CIRCUIT

The conventional electronic tuning circuit which has hitherto been employed for UHF applications comprises a straigth transmission line segment, a varactor having one of its electrodes connected to one end of the transmission line and a DC blocking capacitor having one of its electrodes connected to the opposite end of the transmission line. The other electrodes of the varactor and the blocking capacitors are both connected to ground so as to form a closed loop resonance circuit. To control the capacitance of the varactor, a DC control signal is applied through an RF choke coil to one electrode of the varactor so the one electrode is biased with respect to the other electrode. Since the connections to ground terminals constitute a part of the resonance circuit, the UHF energy is partially wasted by a high impedance which may be introduced by the ground connections. Furthermore, because of the straight-line configuration, the prior art tuning circuit tends to dissipate its energy through its environment without serving any useful purposes.

SUMMARY OF THE INVENTION

The primary object of the invention is to provide an electronic tuning circuit which operates with a minimum of energy loss.

Another object is to provide an electronic tuning circuit which is suitable for adaptation to integrated circuit fabrication.

The primary object of the invention is realized by formation of a transmission line in a generally C-shaped configuration and connecting a varactor and a DC blocking capacitor in series with the transmission line to form a closed loop radio-frequency resonance circuit. The invention contemplates the use of two RF chokes, one of which is connected between one terminal of the varactor and a control voltage source and the other being connected between the other terminal of the varactor and ground. The RF choke coils allow the DC control current to pass through the varactor while preventing the passage of RF current therethrough. The DC blocking capacitor has a low impedance at radio frequencies and prevents the varactor from being short-circuited by the transmission line which also serves as a path for the DC control current.

BRIEF DESCRIPTION OF THE DRAWINGS

This and other objects, features and advantages of the invention will be understood by the following description taken in conjunction with the accompanying drawings, in which.

FIG. *2a* is a plan view of the electronic tuning circuit shown mounted on a dielectric substrate, and FIGS. *2b–2c* are cross-sectional views taken along the lines A—A' of FIG. *2a;*

Figure 3:
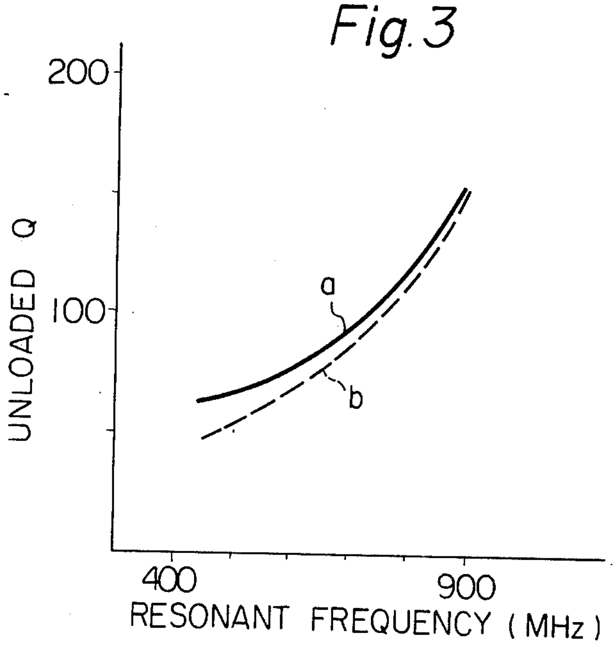

FIG. 3 is a graph showing an electrical characteristic according to the present embodiments in comparison with the prior art electronic tuning circuit;

FIGS. *4a–4c* are illustrations of modified forms of the present invention;

FIG. *4d* is a cross-sectional view taken on the line A—A' of FIG. *4a;*

FIG. *5a* is a modification of the preferred embodiment of FIG. *4a;*

FIG. *5b* is a cross-sectional view taken through the lines A—A', FIG. *5a;*

Figure 7:
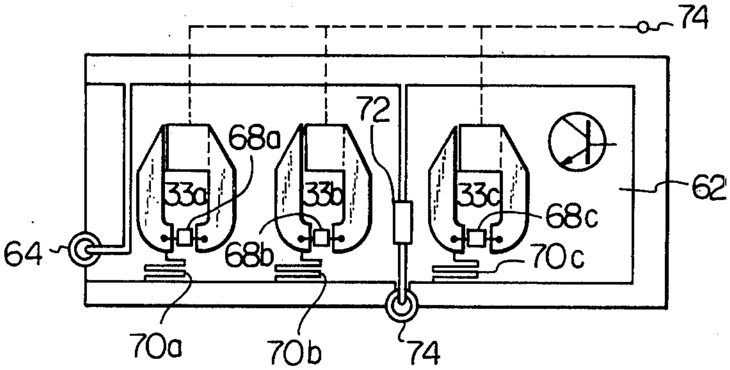
Figure 9B:
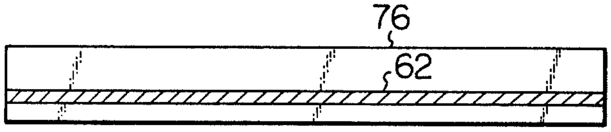
Figure 8:
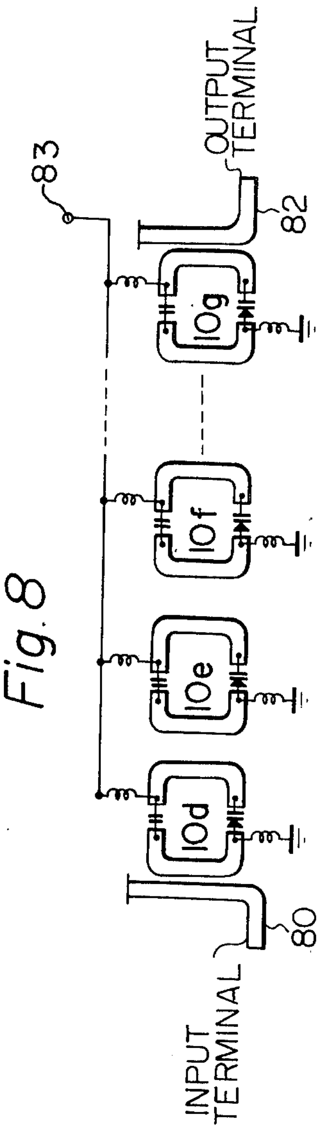
Figure 9:
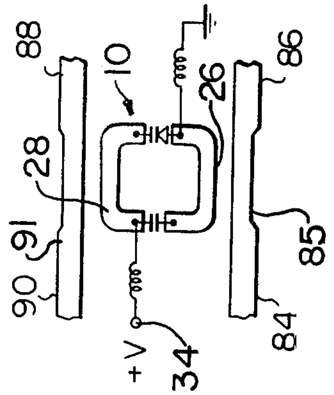
Figure 10:
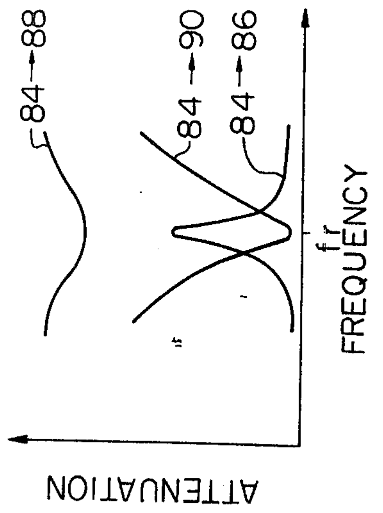

FIGS. 6–9 illustrate applications of the preferred embodiments of the present invention; and FIG. 10 is a graph showing an electrical characteristic of the application of FIG. 9.

DETAILED DESCRIPTION

Figure 1:
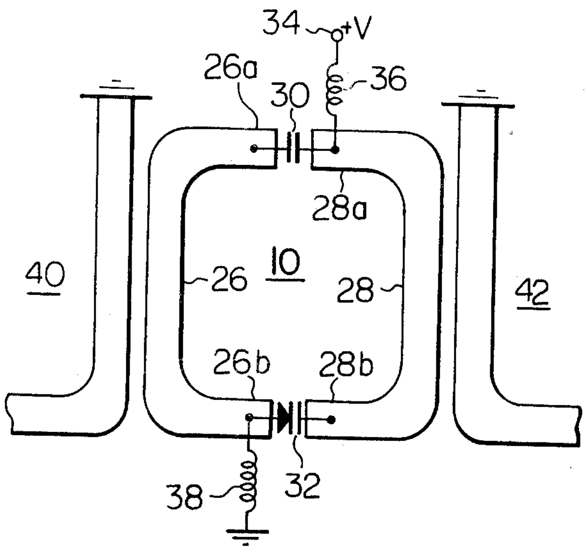
FIG. 1 is a preferred embodiment of the electronic tuning circuit of the invention.

Reference is now made to FIG. 1 which illustrates an electronic tuning circuit 10 embodying the present invention. As shown, the tuning circuit 10 comprises a transmission line formed by identical, generally C-shaped conductive strips 26 and 28. The strip 26 constitutes a first section of the transmission line which is only reactively coupled with an input circuit 40 and the strip 28 constitutes a second section of the transmission line which is only reactively coupled with an output circuit 42. A DC blocking capacitor 30 is provided between the ends *26a* and *28a* of strips 26 and 28, respectively, and a varactor 32 is provided between the ends *26b* and *28b*. A DC control voltage is supplied to varactor 32 from a terminal 34 through an RF choke coil 36 and strip 28. A second RF control choke coil 38 is connected between end portion *26b* and ground to block high-frequency currents and allows the second RF control current to flow therethrough to ground.

In operation, the input microwave energy is coupled through input circuit 40 to the first section 26 of the transmission line and then coupled through the DC blocking capacitor 30 to the second section 28. The DC blocking capacitor 30 offers a low impedance to the radio frequency current so that strips 26 and 28 act as a single transmission line. The microwave energy in the second section 28 is coupled to output circuit 42. Tuning is effected by controlling the voltage applied at terminal 34 to vary the capacitance of the varactor 32 and therefore the resonant frequency of the tuning circuit 10. Therefore, the microwave energy extracted from the output circuit 42 is tuned to the resonant frequency of the circuit 10. Since the microwave current is allowed to pass through the closed loop low loss circuit, and no ground connection exists in the closed loop, the present invention offers a higher Q value than the prior art tuning circuit. Furthermore, the closed-loop configuration of the tuning circuit 10 confines the microwave energy to a limited area, so there are strong reactive couplings with the input and output circuits and microwave energy is transferred from the input to the output with a minimum of wasted energy.

Figure 2A:
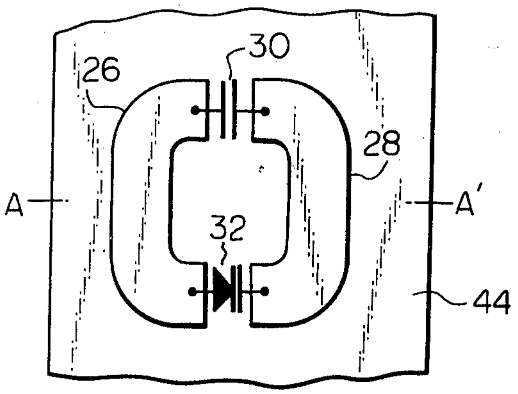
Figure 2B:
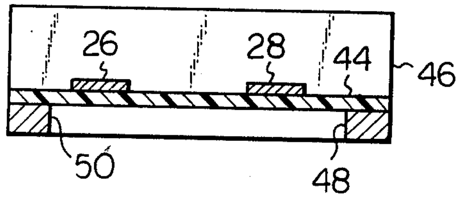
Figure 2C:
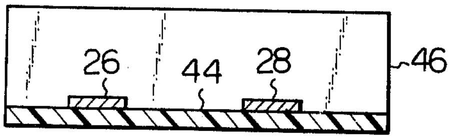

As shown in FIG. *2a*, the tuning circuit 10 with the RF choke coils removed is shown mounted on a dielectric substrate 44 which is mounted in a metal housing 46 preferably with a close spacing to the bottom wall of the housing as illustrated in FIG. *2b*. Substrate 44 should be positioned as illustrated, and not midway between the top and bottom of casing 46. The illustrated mounting of dielectric support 44 imparts a high circuit Q value to the tuning circuit, which in turn allows the use of an inexpensive material of high dielectric loss, such as glass or epoxy-glass laminates, etc. The dielectric substrate 44 may be mounted on the bottom wall as illustrated in FIG. *2c*, in which case the dielectric loss of the substrate 44 tends to adversely affect the Q value of the tuning circuit, and thus the use of a relative lower dielectric material such as ceramics of polytetrafluorethylene, is preferred. FIG. 3 includes two curves wherein a curve *a* denotes the unloaded Q as a function of resonant frequency according to the circuit of the type shown in FIG. 2*b*, and a curve *b* obtained from the prior art straight-line type tuning circuit. For the purpose of exact comparison of the characteristics as shown in FIG. 3, the circuits of the prior art and FIG. 2*b* of the invention are designed such that each of the substrates used is 1.6 mm thick and 4 mm wide, and the inner height of the housings of both prior art and the invention is 15 mm, and the varactors are of silicon type. It is seen from the graph of FIG. 3 that the circuit Q of the FIG. 2*b* circuit is especially high in the lower range of the resonant frequency. This is desirable since the silicon type varactors have larger series resistance in the lower range of the resonant frequency than in the higher. Therefore, according to the present embodiments, the high Q in the lower range can improve the noise figure of the circuit.

Reference is now made to FIGS. 4*a*–4*d*, which illustrate another preferred embodiment of the present invention, in which the DC blocking capacitor 30 is formed by overlapping portions of the strips 26 and 28 with the dielectric substrate between them as clearly shown in FIG. 4*d*. The capacitance may be increased as desired by increasing the overlapped area relative to the other areas as illustrated in FIG. 4*c*. This is also possible by the use of a thin dielectric substrate of a material of low dielectric loss. A tuning circuit of a frequency range from 470 MHz to 920 MHz was obtained from the following manufacturing parameters:

(1) Substrate material: Polytetrafluorethylene glass laminate
(2) Substrate thickness: 0.4 mm
(3) Capacitor area: 15 mm$^2$ (approx. 11 pF)
(4) Capacitance ratio of varactor: 1:7.6
(5) Substrate spacing from bottom wall: 15 mm FIGS. 5*a* and 5*b* are views showing the actual physical construction of a closed loop tuned circuit similar to that illustrated in FIG. 4*a*. In FIGS. 5*a* and 5*b*, diode 32 has a pair of oppositely extending leads that are connected to metallic coatings 26 and 28 on substrate 44. A lumped parameter capacitor subsists between a portion of metallic coating 28 on the upper portion of substrate 44 and the circular, closed loop metallic partial ring 26. A fixed capacitance is thereby provided between metallic coatings 26 and 28 on the upper face of substrate 44, while a variable capacitance is provided between the leads of varactor diode 32.

Figure 6:
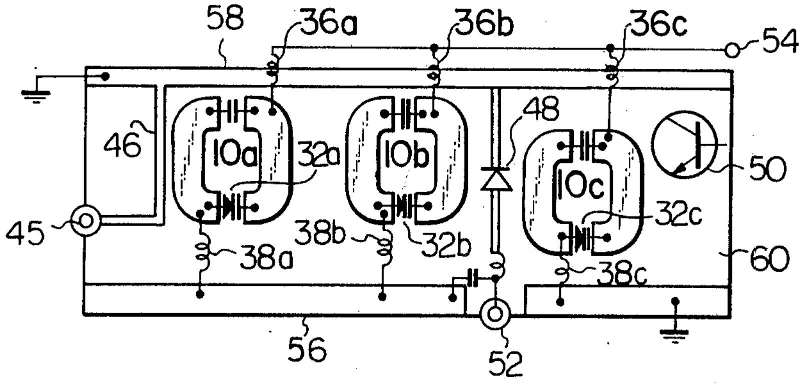

FIG. 6 illustrates an application of the circuit of FIG. 1 to a UHF tuner without an r-f amplifier. A UHF signal is applied to the tuner through an input terminal 45 and then fed through a conducting line 46 to a double-tuned bandpass filter circuit including circuits **10*a* and 10*b* each. The signal from the double-tuned circuit is applied to a diode 48, which serves as a mixer, and to which a signal is also applied from a local oscillator including a circuit 10*c* and a transistor 50. The mixer, as is well known in the art, generates an intermediate frequency signal by mixing the two received signals. The IF signal is fed through a terminal 52 to the next stage (not shown). A variable d.c. voltage is applied to varactors 32*a*–32*c* through a terminal 54 for the purpose of changing resonant frequencies of the circuits 10*a*–10*c*, respectively. Choke coils 38*a*–38*c* are provided between the circuits 10*a*–10*c* and a conductive strip 56, respectively, in order to make direct current paths. As shown, conductive strips 56 and 58** are grounded.

FIG. 7 is a modification of FIG. 6 in which each tuning circuit is replaced with the circuit of FIG. 4*c*. This form of tuner is more suitable for integrated circuit fabrication.

FIG. 8 is an illustration of a bandpass filter utilizing N of the tuning circuits of FIG. 1, where N is a positive integer greater than one. A UHF signal is applied to an input terminal 80 and then transmitted to an output terminal 82 through a plurality of successively arranged tuning circuits **10*d*–10*g* The resonant frequency of each of the circuits 10*d*–10*g* is determined by a variable d.c. voltage applied to a terminal 83**.

The tuning circuits are arranged such that each linear portion of each tuning circuit of the transmission line is adjacent to and parallel with a linear portion of the adjacent tuning circuit so that microwave energy is transferred with a minimum of energy loss from the input terminal 80 to the output terminal 82. High frequency-selectivity can be obtained by providing as many such tuning circuits as desired.

FIG. 9 is an illustration of a directional coupler utilizing the embodiment of FIG. 1. The directional coupler comprises first and second transmission lines 85 and 91. Line 85 includes an input port 84, to which microwave energy is applied, and an output port 86, while line 91 includes second and third output ports 88 and 90. Between transmission lines 85 and 91 is tuning circuit 10 having first and second half-sections 26 and 28 respectively extending parallel with the first and second transmission lines 85 and 91.

The operation of the FIG. 9 embodiment is best understood with reference to FIG. 10. The input energy at port 84 is coupled with low attenuation to output port 86 when the frequency of the energy is outside the resonant frequency $f_r$ of the tuning circuit 10. When the input frequency approaches the resonant frequency $f_r$, the input signal is transmitted through the tuning circuit 10 to the third output port 90 and the attenuation between ports 84 and 90 is at a minimum at the resonant frequency. On the other hand, the attenuation between the input port 84 and the second output port 88 is remarkably high so that no signal coupling occurs between them. It is thus understood that the arrangement of FIG. 9 operates as a directional coupler by varying the DC potential, +V, on terminal 34. For example, an input signal at frequency $f_r$ can be switched so energy at input port 84, initially coupled to output port 86, is transferred to port 90 by increasing the resonant frequency of circuit 10 to a level above $f_r$.

What is claimed is:

1. An electronic tuning circuit comprising a transmission line having a first section only reactively coupled with an input circuit and a second section only reactively coupled with an output circuit, a voltage-controlled capacitor having first and second terminals respectively having connections to said first and second sections to form with said sections a closed-loop resonant circuit, first and second RF choke coils respectively connected to said first and second terminals of said voltage-controlled capacitor to supply a DC control potential between said first and second terminals, and a DC blocking capacitor having a low impedance to a radio-frequency current and electrically connected in said resonance circuit to prevent said DC control potential from being supplied to said second terminal of said voltage-controlled capacitor.

2. The electronic tuning circuit of claim 1, wherein said transmission line comprises first and second generally C-shaped half-sections and wherein said DC blocking capacitor is between first ends of said half-sections and said voltage-control capacitor is connected between second ends of said half-sections in a position opposite to said blocking capacitor.

3. The electronic tuning circuit of claim 2, wherein said transmission line is disposed on a dielectric substrate.

4. The electronic tuning circuit of claim 3, further comprising a metal housing in which said tuning circuit is located, said dielectric substrate being spaced from the bottom and top walls of said metal housing.

5. The electronic tuning circuit of claim 3, wherein portions of said first ends of said half-sections overlap each other with said dielectric substrate disposed therebetween so as to form said DC blocking capacitor.

6. The electronic tuning circuit of claim 2, wherein said first generally C-shaped half-section includes a linear portion and said input circuit includes a linear conductor disposed adjacent to and parallel with the linear portion of said first half-section and said second generally C-shaped half-section includes a linear portion and said output circuit includes a linear conductor disposed adjacent to and parallel with the linear portion of said second half-section.

7. A filter comprising a plurality of closed-loop successively arranged tuning elements each including a transmission line and a voltage-controlled capacitor connected thereto to form a closed loop resonant circuit, first and second RF choke coils connected respectively to the terminals of said voltage-controlled capacitor to supply a DC control potential to one terminal of the capacitor with respect to the other terminal thereof, and a DC blocking capacitor connected in said closed loop resonant circuit to prevent said DC control potential from being supplied to said other terminal of the voltage-controlled capacitor, each of said transmission lines of said tuning elements including first and second linear portions, the first linear portion of each tuning element being disposed adjacent to the second linear portion of an adjacent tuning element, an input conductor adjacent to and parallel with the first linear portion of one of said tuning elements located at one end of the arrangement, and an output conductor adjacent to and parallel with the second linear portion of another tuning element located at the opposite end of said arrangement.

8. A directional coupler comprising:

a first transmission line;

a second transmission line parallel with said first transmission line; and a tuning circuit having a third transmission line and a voltage-controlled capacitor connected to the third transmission line to form a closed loop resonant circuit, first and second RF choke coils connected respectively to the opposite terminals of said voltage-controlled capacitor to supply a DC control potential to one terminal thereof with respect to the other terminal thereof, and a DC blocking capacitor connected in the closed loop resonant circuit to prevent said DC control potential from being applied to said other terminal of said voltage-controlled capacitor, said third transmission line having a first linear portion adjacent to and parallel with said first transmission line and a second linear portion adjacent to and parallel with said second transmission line.

9. A circuit tuned to an RF energy source comprising a first conducting section having first and second end portions and a midportion for only reactively coupling RF energy to the tuned circuit; a second conducting section having third and fourth end portions and a midportion for only reactively coupling the RF energy from the tuned circuit; a DC blocking capacitor connected in series between the first and third end portions, said blocking capacitor having a low impedance to the RF energy; a voltage controlled variable capacitor connected in series between the second and fourth end portions so that first and second electrodes of the variable capacitor are connected to the second and fourth end portions, said first and second sections and the voltage controlled capacitor forming a closed-loop resonant circuit for the RF energy; and means for applying a bias voltage from a control source to the variable capacitor to control the capacitance of the variable capacitor and resonant frequency of the closed loop, said means for applying including first and second choke coils respectively connected to first and second terminals of the control source and to the first and second electrodes, one of said terminals of the control source being at ground potential, said choke coils preventing coupling of the RF energy to ground potential and said blocking capacitor preventing coupling of the voltage of the control source between the first and second sections and the electrodes of the variable capacitor.

10. The circuit of claim 9 wherein the midportion of the first section includes a first linear conductor disposed adjacent and parallel with a second linear conductor of a circuit that supplies the energy to the tuned circuit, the midportion of the second section including a third linear conductor disposed adjacent and parallel with a fourth linear conductor of a circuit that withdraws energy from the tuned circuit.

11. A filter for a band of frequencies of an RF energy source comprising N cascaded tuned circuits, where N is a positive integer greater than one, each of the tuned circuits including: a first conducting section having first and second end portions and a midportion for only reactively coupling RF energy to the tuned circuit, a second conducting section having third and fourth end portions and a midportion for only reactively coupling the RF energy from the tuned circuit, a DC blocking capacitor connected in series between the first and third end portions, said blocking capacitor having a low impedance to the RF energy, a voltage controlled variable capacitor connected in series between the second and fourth end portions so that first and second electrodes of the variable capacitor are connected to the second and fourth end portions, said first and second sections and the voltage controlled capacitor forming a closed-loop resonant circuit for the RF energy, means for applying a bias voltage from a control source to the variable capacitor to control the capacitance of the variable capacitor and resonant frequency of the closed loop, said means for applying including first and second choke coils respectively connected to first and second terminals of the control source and to the first and second electrodes, one of said terminals of the control source being at ground potential, said choke coils preventing coupling of the RF energy to ground potential and said blocking capacitor preventing coupling of the voltage of the control source between the first and second sections and the electrodes of the variable capacitor; the midportion of the second conducting portion of the $k$ th tuned circuit being only reactively coupled to the midportion of the first conducting portion of the $(k + 1)$ th tuned circuit, where $k$ equals every integer from 1 to $(N - 1)$.

12. The filter of claim 11, wherein the midportion of the first section of the $k$ th tuned circuit includes a first linear conductor disposed adjacent and parallel with a second linear conductor of the second section of the $(k-1)$ th tuned circuit, the midportion of the second section of the $k$ th tuned circuit including a third linear conductor disposed adjacent and parallel with a fourth linear conductor of the first portion of the $(k+1)$ th tuned circuit.

13. A directional coupler for selectively feeding RF energy between first, second, third and fourth RF ports comprising a first conducting strip between the first and second ports, a second conducting strip between the third and fourth ports, a tuned circuit for the RF energy, the tuned circuit including: a first conducting section having first and second end portions and a midportion for only reactively coupling RF energy between the first conducting strip and the tuned circuit; a second conducting section having third and fourth end portions and a midportion for only reactively coupling the RF energy between the tuned circuit and the second conducting strip, a DC blocking capacitor connected in series between the first and third end portions, said blocking capacitor having a low impedance to the RF energy, a voltage controlled variable capacitor connected in series between the second and fourth end portions so that first and second electrodes of the variable capacitor are connected to the second and fourth end portions, said first and second sections and the voltage controlled capacitor forming a closed-loop resonant circuit for RF energy, means for applying a bias voltage from a control source to the variable capacitor to control the capacitance of the variable capacitor and resonant frequency of the closed loop, said means for applying including first and second choke coils respectively connected to first and second terminals of the control source and to the first and second electrodes, one of said terminals of the control source being at ground potential, said choke coils preventing coupling of the RF energy to ground potential and said blocking capacitor preventing coupling of the voltage of the control source between the first and second sections and the electrodes of the variable capacitor.

14. The circuit of claim 13 wherein the midportion of the section includes a first linear conductor disposed adjacent and parallel with the first conducting strip, the first conducting strip being a linear conductor, and the midportion of the second section including a third linear conductor disposed adjacent and parallel with the second conducting strip, the second conducting strip being a linear conductor.

15. A circuit tuned to an RF energy source comprising a first conducting section having first and second end portions and a midportion for only reactively coupling RF energy to the tuned circuit, a second conducting section having third and fourth end portions and a midportion; a DC blocking capacitor connected in series between the first and third end portions, said blocking capacitor having a low impedance to the RF energy, a voltage controlled variable capacitor connected in series between the second and fourth end portions so that first and second electrodes of the variable capacitor are connected to the second and forth end portions, said first and second sections and the voltage controlled capacitor forming a closed-loop resonant circuit for the RF energy, and means for applying a bias voltage from a control source to the variable capacitor to control the capacitance of the variable capacitor and resonant frequency of the closed loop, said means for applying including first and second choke coils respectively connected to first and second terminals of the control source and to the first and second electrodes, one of said terminals of the control source being at ground potential, said choke coils preventing coupling of the RF energy to ground potential and said blocking capacitor preventing coupling of the voltage of the control source between the first and second sections and the electrodes of the variable capacitor.

* * * * *